(12) United States Patent
Moallem

(10) Patent No.: US 11,417,938 B2
(45) Date of Patent: Aug. 16, 2022

(54) PRINTED CIRCUIT BOARD WITH SUBSTRATE-INTEGRATED WAVEGUIDE TRANSITION

(71) Applicant: Texas Instruments Incorporated, Dallas, TX (US)

(72) Inventor: Meysam Moallem, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 429 days.

(21) Appl. No.: 16/559,492

(22) Filed: Sep. 3, 2019

(65) Prior Publication Data
US 2019/0393581 A1 Dec. 26, 2019

Related U.S. Application Data

(63) Continuation of application No. 15/859,393, filed on Dec. 30, 2017, now Pat. No. 10,403,954.

(51) Int. Cl.
*H01Q 1/38* (2006.01)
*H01P 5/107* (2006.01)
(Continued)

(52) U.S. Cl.
CPC .............. *H01P 5/107* (2013.01); *H01L 23/66* (2013.01); *H01Q 1/2283* (2013.01); *H05K 1/024* (2013.01); *H05K 1/0242* (2013.01); *H05K 1/115* (2013.01); *H05K 1/144* (2013.01); *H01L 2223/6627* (2013.01); *H01L 2223/6683* (2013.01); *H01Q 1/38* (2013.01); *H05K 2201/042* (2013.01); *H05K 2201/09618* (2013.01)

(58) Field of Classification Search
CPC . H01Q 1/22; H01Q 1/38; H01L 23/66; H05K 1/02; H05K 1/11; H05K 1/14
See application file for complete search history.

(56) References Cited

U.S. PATENT DOCUMENTS

2003/0141940 A1* 7/2003 Le Bihan ................ H01P 5/107
333/26

OTHER PUBLICATIONS

Yoke-Choy Leong and Sander Weinreb, "Full Band Waveguide-to-Microstrip Probe Transitions," Microwave Symposium Digest, 1999 IEEE MTT-S International, IEEE Xplore, Aug. 6, 2002, DOI 10.1109/MWSY.1999.780219.
(Continued)

*Primary Examiner* — Andrea Lindgren Baltzell
(74) *Attorney, Agent, or Firm* — Dawn Jos; Charles A. Brill; Frank D. Cimino

(57) ABSTRACT

In described examples, an integrated waveguide transition includes a substrate with a waveguide side and an opposing waveguide termination side. A first layer of metal covers a portion of the waveguide side, a second layer of metal is separated from the first layer of metal by a first layer of dielectric, and a third layer of metal covers a portion of the waveguide termination side and is separated from the second layer of metal by a second layer of dielectric. A substrate waveguide perpendicular to a plane of the substrate extends from the waveguide side to the waveguide termination side; and a length and a width of the substrate waveguide is defined by a fence of ground-stitching vias that short the first layer of metal and the second layer of metal to a plate of the third layer of metal that forms a back short.

17 Claims, 7 Drawing Sheets

(51) Int. Cl.
     *H05K 1/02*          (2006.01)
     *H05K 1/11*          (2006.01)
     *H05K 1/14*          (2006.01)
     *H01L 23/66*         (2006.01)
     *H01Q 1/22*         (2006.01)

(56) References Cited

OTHER PUBLICATIONS

"Comparing Microstrip and Grounded Coplanar Waveguide," Microwave Journal, May 12, 2015, accessed at www.microwavejournal.com/blogs/l-rog-blog/post/24374-comparing-microstrip-and-grounded-coplanar-waveguide, Dec. 30, 2017.

J.-H. Choi, K. Tokuda, H. Ogawa and Y.-H. Kim, "Gap-coupled patch-type waveguide-to-microstrip transition on single-layer dielectric substrate at V-band" Electronic Letters, Aug. 19, 2004, vol. 40 No. 17, pp. 1067-1068, DOI, 10.1049/el:20045144.

\* cited by examiner she# PRINTED CIRCUIT BOARD WITH SUBSTRATE-INTEGRATED WAVEGUIDE TRANSITION This application is a continuation of U.S. patent application Ser. No. 15/859,393, filed Dec. 30, 2017, the contents of which is herein incorporated by reference in its entirety.

TECHNICAL FIELD

This disclosure relates generally to substrates that couple to waveguides, and more particularly to substrates such as printed circuit boards with a planar transmission line that couples to a waveguide.

BACKGROUND

High frequency (HF) integrated circuits (ICs) generate millimeter-wave (MMW) signals such as those used for automotive radar (from 76 GHz to 81 GHz). Planar transmission lines on a substrate, such as a printed circuit board (PCB), carry the MMW signal from one location on the PCB to another location. For example, a planar transmission line may carry a MMW signal from one MMW IC to another IC on the PCB, from a MMW IC to a radiating element or antenna, or from a MMW IC to a waveguide transition built into the PCB (a PCB waveguide transition). The PCB waveguide transition couples the MMW signals from the planar transmission line on the PCB into an external waveguide. Alternatively, the PCB waveguide transition can couple an incoming MMW signal from an external waveguide onto the planar transmission line on the PCB.

PCBs are formed of dielectric materials and layers of conductive metal separated by dielectric layers. A PCB waveguide transition is formed by etching a PCB waveguide through the PCB, coating the sidewalls of the PCB waveguide with a conductive material, attaching a waveguide termination to one end of the PCB waveguide, and attaching a probe to the end of the planar transmission line on the PCB. The probe is positioned in the PCB waveguide to couple the MMW signal from a planar transmission line on the PCB to the external waveguide. PCB waveguide transitions require complex manufacturing including: substrate etching; sidewall plating; and manual probe positioning and attachment. These processes are not compatible with high volume and low cost PCB manufacturing.

SUMMARY

In described examples, an integrated waveguide transition includes a substrate with a waveguide side and an opposing waveguide termination side. A first layer of metal covers a portion of the waveguide side; a second layer of metal separated from the first layer of metal by a first layer of dielectric; a third layer of metal covering a portion of the waveguide termination side and separated from the second layer of metal by a second layer of dielectric; a substrate waveguide perpendicular to a plane of the substrate and extending from the waveguide side to the waveguide termination side of the substrate; and a length and a width of a cross section of the substrate waveguide defined by a fence of ground-stitching vias that short the first layer of metal and the second layer of metal to a plate of the third layer of metal that forms a back short of the substrate waveguide.

In additional described examples, a packaged integrated circuit includes: a substrate including a substrate-integrated waveguide transition; a millimeter wave integrated circuit (IC) mounted on the substrate; and a waveguide mounting shim coupled to the substrate. The millimeter wave IC and the substrate are in the packaged integrated circuit; and the waveguide mounting shim is external to the packaged integrated circuit.

DETAILED DESCRIPTION

Corresponding numerals and symbols in the different figures generally refer to corresponding parts, unless otherwise indicated. The figures are not necessarily drawn to scale.

As is further described herein below, certain structures and surfaces are described as "parallel" to one another. For purposes of this disclosure, two elements are "parallel" when the elements are intended to lie in planes that, when extended, will not meet. However, the term parallel as used herein also includes surfaces that may slightly deviate in direction due to manufacturing tolerances. If the two surfaces generally lie in planes that are spaced apart and which would not intersect when extended infinitely if the surfaces were made without these manufacturing deviations, these surfaces are also parallel.

As is further described hereinbelow, certain structures and surfaces are described as "perpendicular" to one another. For purposes of this disclosure, two elements are "perpendicular" when the elements are intended to form a 90-degree angle at their intersection. However, the term "perpendicular" as used herein also includes intersections that may slightly deviate from 90 degrees due to manufacturing tolerances.

As is further described hereinbelow, certain structures and surfaces are described as "coplanar" with one another. For purposes of this disclosure, two elements are "coplanar" when the elements are formed in the same horizontal layer of material. However, the term "coplanar" as used herein also includes elements that may slightly deviate from being exactly in the same plane due to manufacturing tolerances.

In the arrangements, a substrate-integrated waveguide transition (SIWT) is formed with a back short to provide a transition from a planar waveguide on a substrate to a waveguide mounted to and extending away from the substrate. The SIWT directs the millimeter wave signal in one direction and terminates the signal in another direction. In an example, the substrate can be a printed circuit board (PCB). Other substrates for use with electrical assembly are also useful with the arrangements.

The MMW frequency range is from 30 GHz to 300 GHz. An integrated waveguide transition design cannot support the whole MMW frequency range. The waveguide transition design can be modified (dimensions, board stack up, etc.) to support a given frequency range within this band. In an example, 71 GHz-86 GHz band is the operating frequency range of the SIWT that covers the frequency range used for automotive radars. The SIWT design can be modified to support different frequency bands, such as 57 GHz to 64 GHz, for example.

Figure 1A:
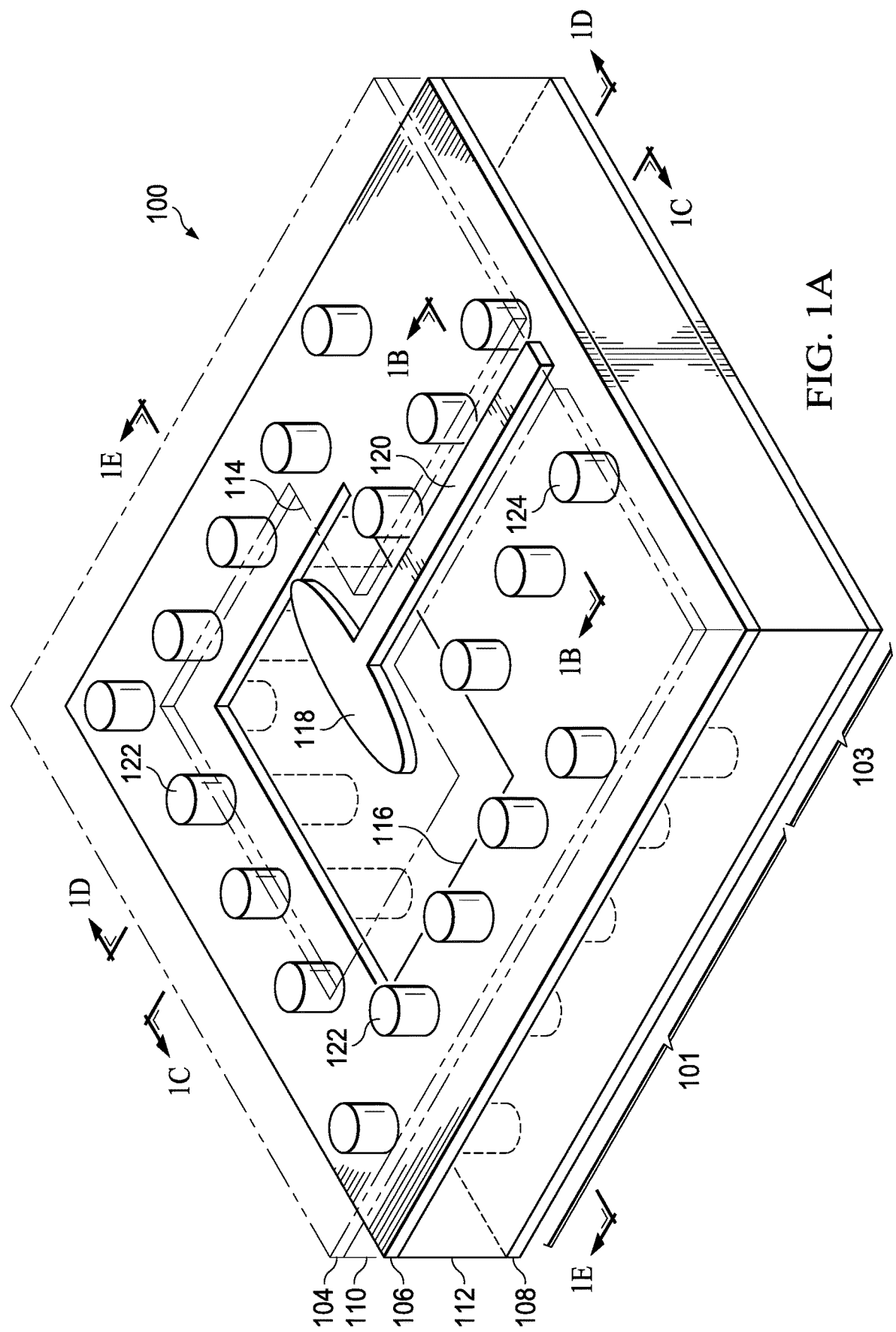
FIG. 1A is a prospective view of a substrate such as a printed circuit board (PCB) with a substrate-integrated waveguide transition.

FIG. 1A illustrates a substrate 100 with a substrate-integrated waveguide transition (SIWT) 101. In an example, the substrate is a printed circuit board (PCB). The SIWT 101 couples a millimeter-wave (MMW) signal from a grounded coplanar waveguide (GCPW) 103, which is a transmission line, on the substrate 100 to an external rectangular waveguide 132 (not visible in FIG. 1A, see 132 in FIG. 1C). The external rectangular waveguide 132 attaches to a waveguide mounting shim 130 on the SIWT 101. Although a rectangular shaped waveguide is used for illustration, any type of hollow or dielectric filled waveguide, such as a circular waveguide, can also be used and these modifications form alternative arrangements.

The waveguide side of the substrate 100 is defined to be the side of the substrate 100 to which the external waveguide (132 in FIG. 1C) is attached. The waveguide termination side of the substrate 100 is the opposing side of the substrate 100 and is the side of the substrate 100 that forms the waveguide back short. The waveguide back short is needed to terminate the SIWT 101 in one direction and to direct the MMW signals in the other direction and into the external waveguide 132 (see FIG. 1C).

In this example, the substrate 100, a PCB, includes three layers of metal spaced from one another by dielectric material. A first layer of metal 104 covers a portion of the waveguide side of the PCB. A second layer of metal 106 is electrically isolated from the first layer of metal 104 by a first dielectric 110. The second layer of metal 106 forms a ground plane for the GCPW 103. A third layer of metal 108 is electrically isolated from the second layer of metal 106 by a second dielectric 112. The thickness of the second layer of dielectric 112 is approximately equal to ¼+/−5% of the wavelength at center operating frequency. The third layer of metal 108 covers a portion of the waveguide termination side of the PCB and forms the back short. The three layers of metal 104, 106, and 108 form parallel planes. In alternative arrangements, more or fewer layers of metal can be used.

The length and width of a cross section of the SIWT are defined by a fence of ground-shorting vias 122. Vias 122 connect the first layer of metal 104 and the second layer of metal 106 to the plate of third layer metal 108 on the waveguide termination side of the PCB. The plate of third layer metal 108 forms the substrate-integrated back short for the SIWT.

The SIWT 101 includes a first substrate waveguide opening 114 in the first layer of metal 104, a second substrate waveguide opening 116 in the second layer of metal 106, and the fence of ground-stitching vias 122 adjacent to and surrounding the perimeter of the first 114 and second 116 waveguide openings. The first and second substrate waveguide openings, 114 and 116, are aligned and are separated from each other by the first dielectric layer 110. The ground stitching vias 122 are perpendicular to the three layers of metal 104, 106, and 108 and short the first 104 and second 106 layers of metal to a plate of the third layer of metal 108. The length and width of the ground-stitching via fence including ground-stitching vias 122 define the length and width of a cross section of the SIWT. The length of the SIWT waveguide is defined by the height of the ground stitching vias 122.

The spacing from one ground stitching via 122 to an adjacent ground stitching via 122 is less than about ¼ of the center operating wavelength of the SIWT. The spacing of third metal layer 108 from second metal layer 106 is equal to about ¼+/−5% of the center operating wavelength of the SIWT.

The SIWT 101 is manufactured using standard PCB manufacturing methods. No additional post processing steps are required. An external waveguide mounting shim 530 (see FIG. 5 and the accompanying description hereinbelow) is later attached to the PCB 500 to provide support for an external waveguide 532.

The length and width of the SIWT openings 114 and 116, and the length and width of the ground-stitching via fence of ground stitching vias 122, depend upon the central operating frequency of the MMW signals of interest and upon the properties of PCB materials. The length and width of the SIWT openings, 114 and 116 are optimized to achieve the best impedance matching and minimum insertion loss when coupling the MMW signal from the GCPW 103 on the PCB 100 to the external waveguide (see 132 FIG. 1C). Impedance matching with a reflection coefficient of less than −10 dB and with an insertion loss of less than 1 dB is desired.

The optimum dimensions of the SIWT openings, 114 and 116, also depend upon the dielectric constants and the thicknesses of the first dielectric 110 and the second dielectric 112. Substrates such as PCBs with SIWTs 101 are selected to have dielectric layers 110 and 112 with low attenuation of the MMW signals of interest. Dielectric material with a dissipation factor of less than 0.01 is desired. However, in alternative arrangements where the opening dimensions are not exactly optimum, the SIWT 101 will couple MMW signals to an external waveguide, even if performance of the device is not fully optimized.

Figure 1B:
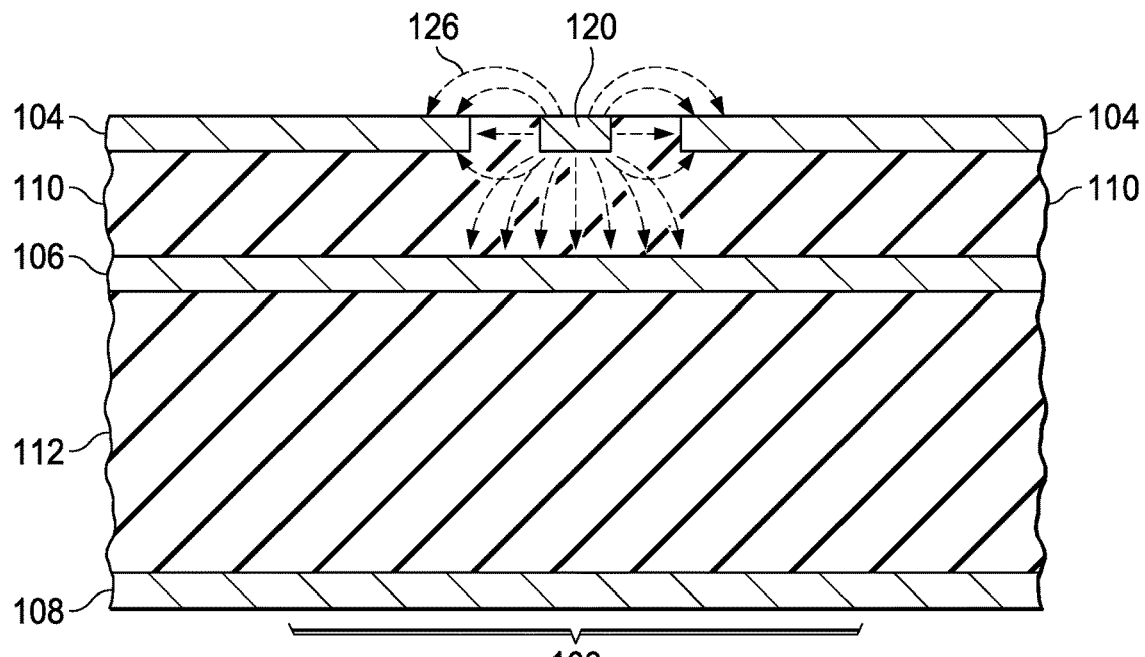
FIGS. 1B-1E are cross sectional views through the substrate in FIG. 1A.

FIG. 1B is a cross section taken perpendicularly through the grounded coplanar waveguide (GCPW) 103, that is, taken along dashed line 1B-1B (FIG. 1A). The GCPW 103 carries MMW signals across the substrate 100. The GCPW 103 includes a signal lead 120 formed in the first metal layer 104 plus first ground plane plates also formed in first layer of metal 104. One first ground plane plate lays adjacent to each side of the signal lead 120 separated from the signal lead 120 by a gap filled with dielectric 110. The first ground plane and the signal lead 120 of the coplanar transmission line are coplanar and are both formed in first metal layer 104.

A second ground plane is formed in second metal layer 106. The second metal layer 106 is electrically isolated from the signal lead 120 and the first ground plane plates by first dielectric layer 110. Electric field lines 126 initiate on the signal lead 120 and terminate on the first and second ground planes (see FIG. 1B).

Figure 1C:
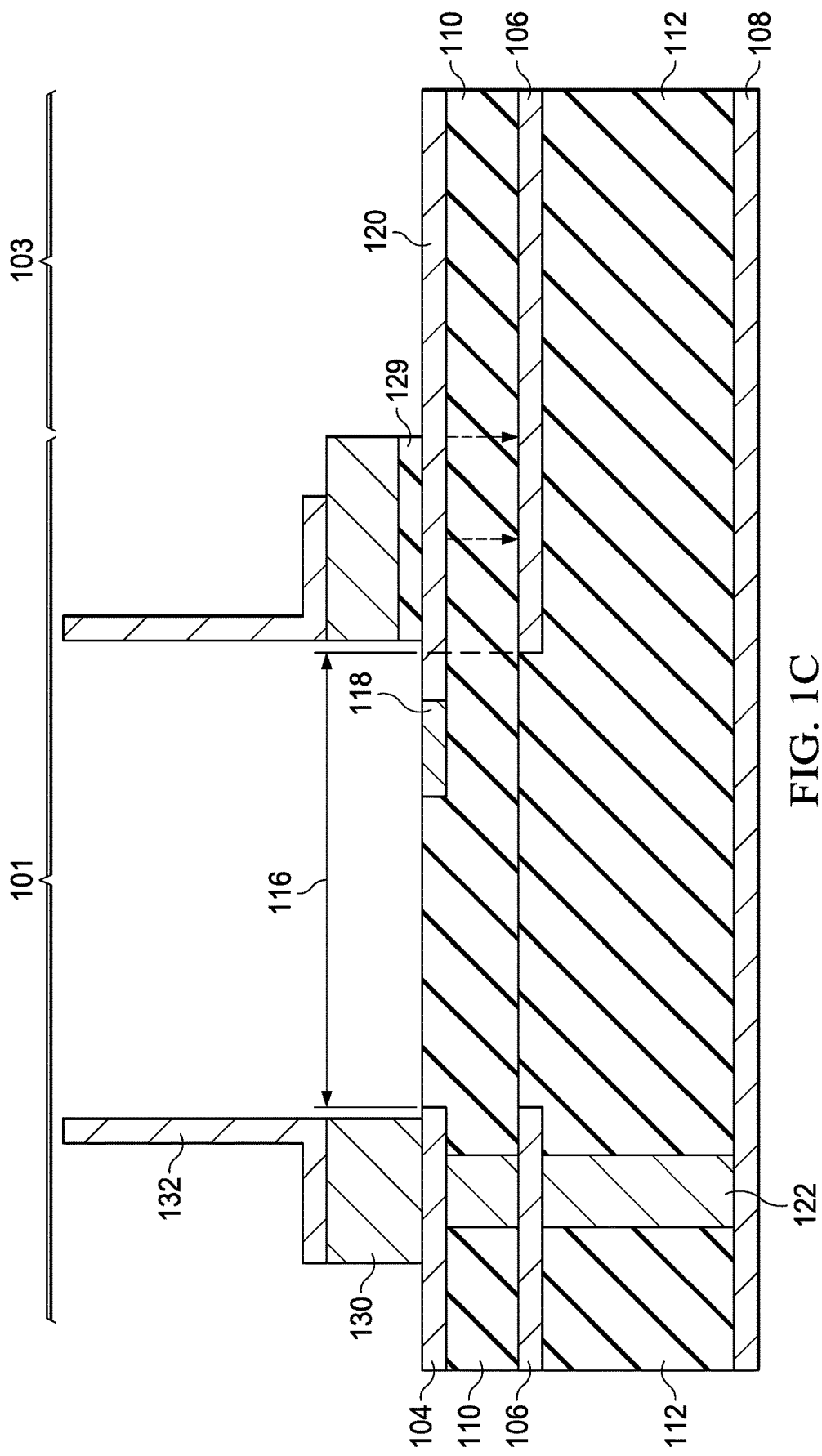

FIG. 1C is a cross section along dashed line, 1C-1C (FIG. 1A), through the middle of the width of the SIWT 101, through the middle of the width of the probe 118 that terminates the signal lead 120, and lengthwise through the signal lead 120 of the GCPW 103. Also shown is a cross sectional view through an external waveguide 132, and waveguide mounting shim 130, mounted on the SIWT 101.

The external waveguide 132 is mounted on a waveguide mounting shim 130 that is mounted on the SIWT 101 and substrate 100. As used herein, a shim is a mechanical spacer to provide a desired spacing between two elements. Shim 130 provides a desired spacing between elements. A slot etched into the mounting shim 130 provides an air gap 129 that electrically isolates the signal lead 120 from the waveguide mounting shim 130. The external waveguide 132; the waveguide mounting shim 130; the three layers of metal 104, 106, and 108; and the ground-stitching vias 122 are coupled to ground.

The probe 118 portion of the signal lead 120 extends between about 10% and 20% into the opening of SIWT 101. The location, size, and shape of the probe 118 can be chosen to tune the resonant frequency and increase the bandwidth of the SIWT 101. The location, size, and shape of the probe 118 can be optimized to achieve optimum or increased coupling of the MMW signal from the GCPW 103 to the external waveguide 132. However, if these characteristics are not optimized, the arrangements will still couple the MMW signals from the GCPW 103 to the SIWT 101 and to the external waveguide 132, even if the overall performance is less than optimal.

Figure 1D:
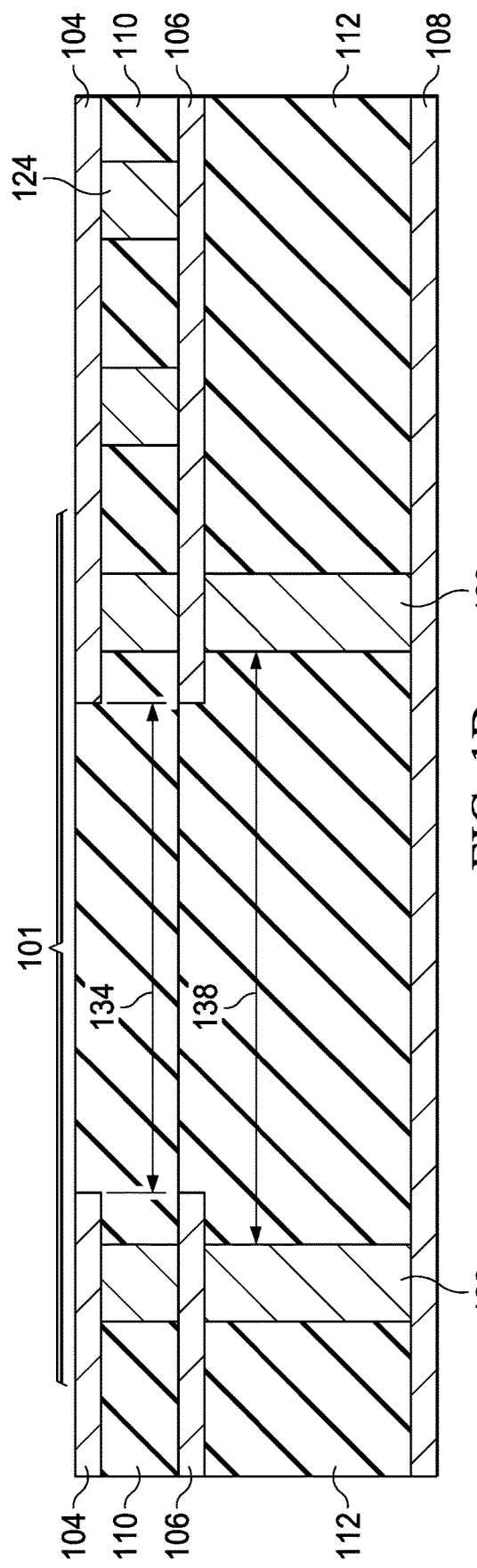

FIG. 1D is a cross section along dashed line, 1D-1D, (FIG. 1A) through the width of the SIWT 101 adjacent to the probe 118. The cross section in FIG. 1D is also through ground stitching vias 122 adjacent to and surrounding the perimeter of the substrate waveguide openings 114 and 116. The shorter dimension 134 of the cross section of the substrate waveguide openings 114 and 116 and shorter dimension 136 of the ground-stitching via fence of the ground vias 122 determines the width of the substrate waveguide in the cross section.

Figure 1E:
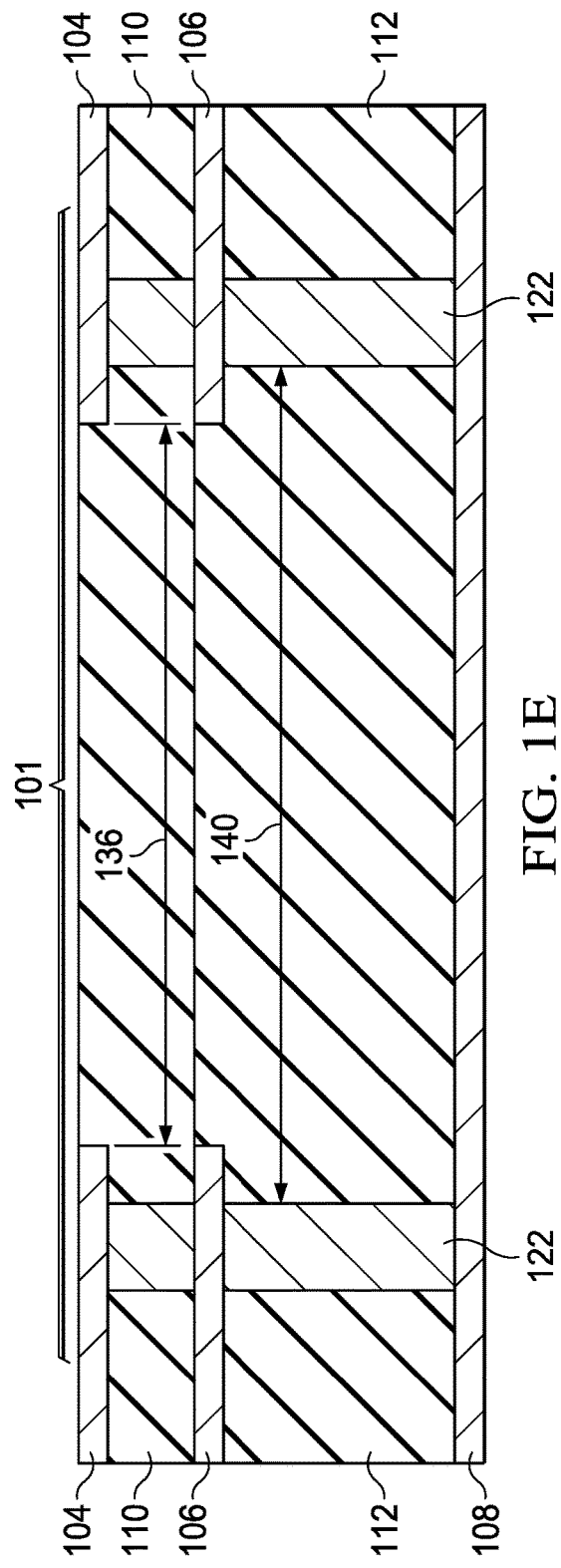

FIG. 1E is a cross section along dashed line 1E-1E, in FIG. 1A through the length of the SIWT 101 adjacent to the probe 118. The cross section is also through ground stitching vias 122 that form a fence adjacent to and surrounding the perimeter of substrate waveguide openings 114 and 116. The longer dimension 136 of substrate waveguide openings 114 and 116 and longer dimension 140 of the ground-stitching via 122 fence determine the length of the substrate waveguide in the cross section.

Figure 2A:
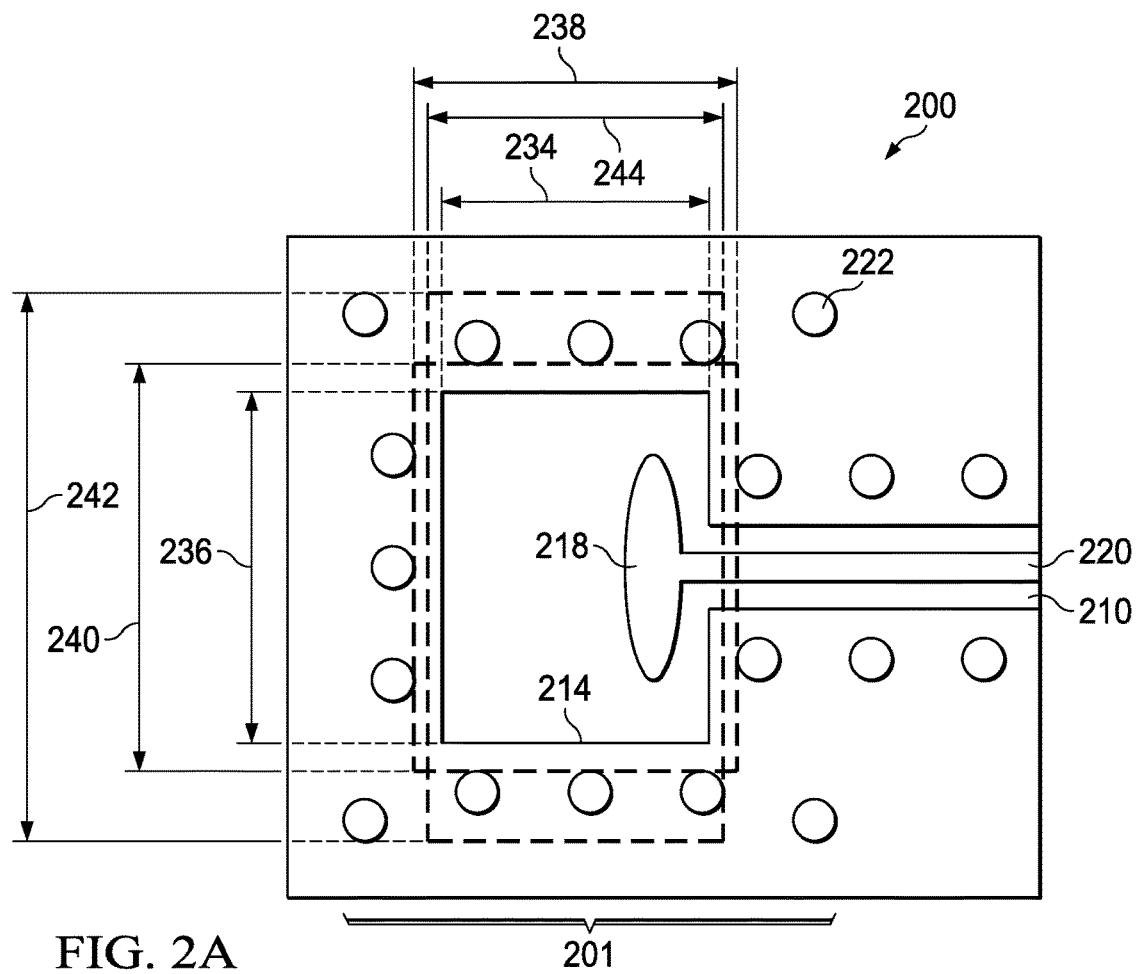
FIGS. 2A-2C are top down views of the substrate-integrated waveguide transition with different probes.
Figure 2B:
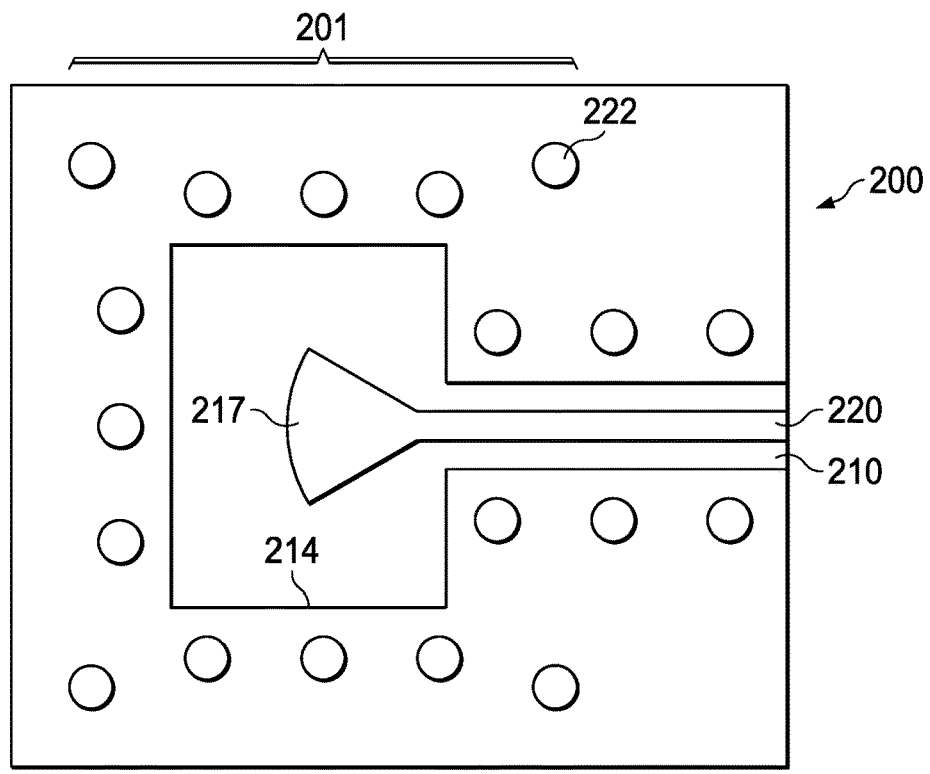
Figure 2C:
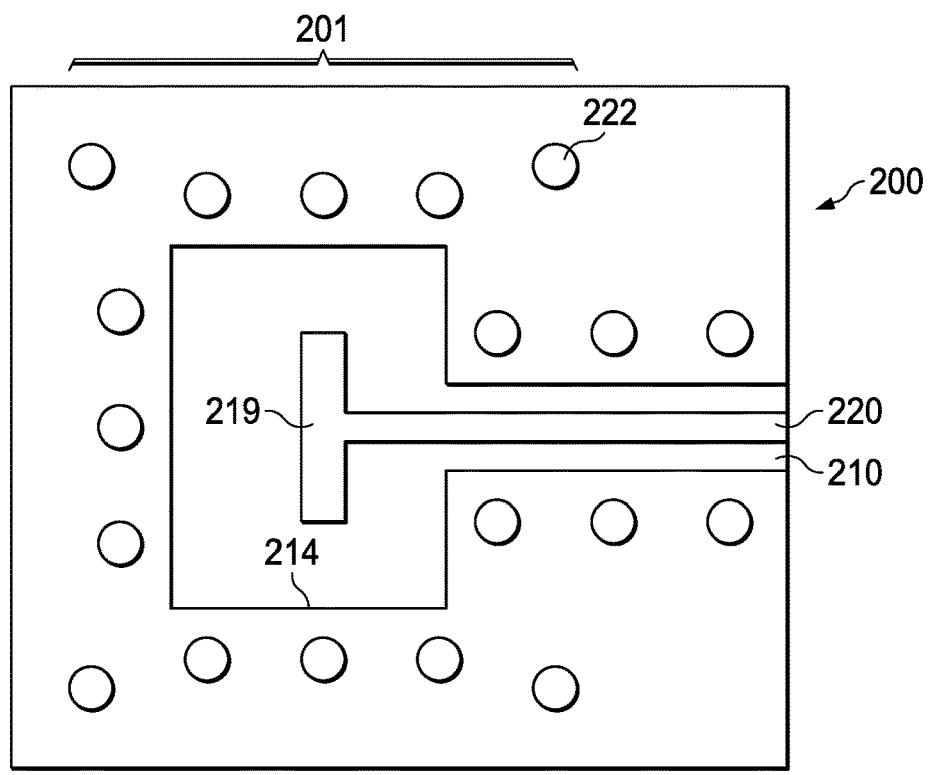

FIG. 2A is a plan view of a substrate 200 including a SIWT 201. Substrate 200 can be a PCB, for example. Other substrates used in electrical assembly can be used. In FIGS. 2A-2C, similar references numerals are used for elements similar to those in FIGS. 1A-1E, for clarity. For example, SIWT 201 corresponds to SIWT 101. FIG. 2A shows a plan view of the SIWT 201 from the waveguide side of the substrate 200. In an example, the substrate is a PCB with built-in SIWT 201 coupled to a WR-12 waveguide (bandwidth of 71 GHz to 86 GHz) is used for illustration.

Dimensions are different for waveguides that operate at different frequencies and dimensions are different for substrates with different substrate material properties. The width and length of the cross section of external WR-12 waveguide in this example is 1.55 millimeters (mm)×3.1 mm. The width and length of the substrate waveguide opening 214 in metal layers one and two are 1.45 mm×1.9 mm. The width and length of the substrate waveguide that is defined by the width and length of the ground-stitching via fence is 2 mm×2.45 mm. These example dimensions are for a SIWT built in a Rogers Corp. RO4835 PCB substrate. These dimensions can be adjusted to form alternative arrangements for other frequency waveguides and for other substrates and for other PCB materials.

FIGS. 2A-2C show plan views of the SIWT 201 on the waveguide side of substrate 200 to illustrate example probe 217, 218, 219 designs. The width, length, size, shape, and positioning of the probe within the SIWT can be optimized to achieve the broadest bandwidth for SIWT 201 and to achieve optimum impedance matching with minimum insertion loss into the external waveguide. Many other probe designs can be used in addition to the ones shown. Note that even in arrangements where the probe position and size is not fully optimized, the SIWT 201 will couple MMW signals to the waveguide, even if overall system performance is not optimized.

FIG. 2A shows an oval shaped probe 218 terminating the end of the signal lead 220. The center of the long side of the oval shaped probe 218 is attached to the end of the signal lead 220. The distance that the signal lead 200 extends into the SIWT 201, and the dimensions and positioning of the oval shaped probe 218 in the openings of the SIWT 201 are determined by modeling and by trial and error to provide the best coupling for the MMW signal from the GCPW 103 to the external waveguide 132 (see FIG. 1A).

FIG. 2B shows the signal lead 220 terminated with a trapezoidal or fan shaped probe 217. The short side of the trapezoidal or fan shaped probe 217 is attached to the end of the signal lead 220. The distance that the signal lead 220 extends into the opening of SIWT 201, and the dimensions and positioning of the trapezoidal or fan shaped probe 217 in the substrate waveguide are determined by modeling and by trial and error to provide the best coupling for the MMW signal from the GCPW 103 to the external waveguide 132 (see FIG. 1C).

FIG. 2C shows the end of the signal lead 220 terminated in the center of the long side of a T-shaped probe 219. The distance that the signal lead 220 extends into the opening of SIWT 201 and the dimensions and positioning of the T-shaped probe 219 in the substrate waveguide are determined by modeling and by trial and error to provide the best coupling for the MMW signal from the GCPW 103 to the external waveguide 132 (see FIG. 1C).

Figure 3:
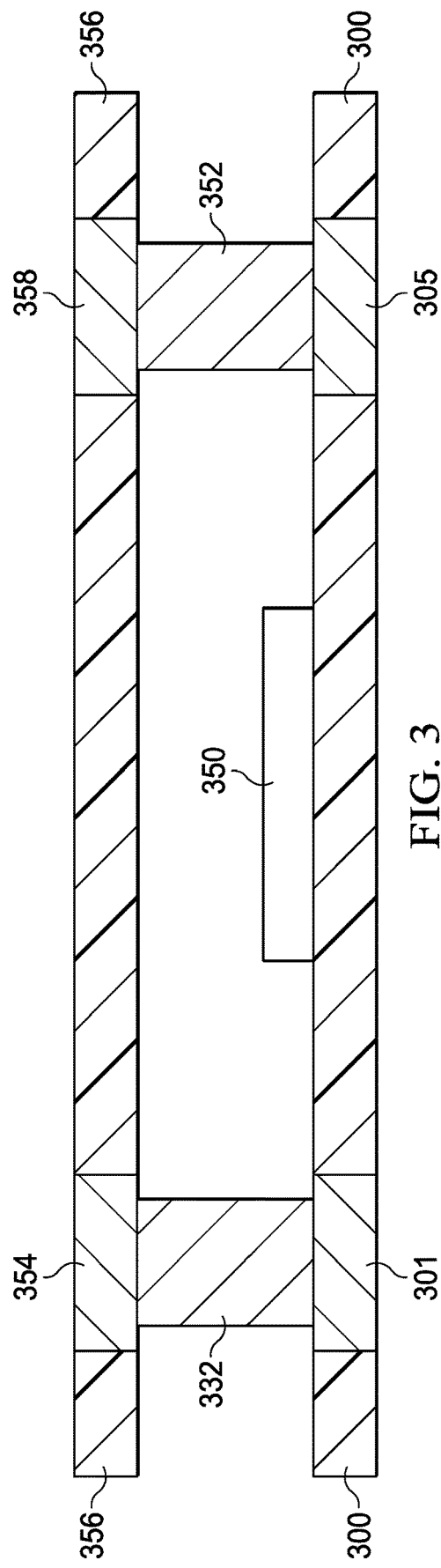
FIG. 3 is a cross section of system with two printed circuit boards that exchange millimeter wave signals through waveguides.

FIG. 3 illustrates in a cross section a MMW circuit system with two substrates, for example two PCBs, 300 and 356. Each PCB has two SIWTs. Waveguides 332 and 352 attached between the SIWTs couple the two PCBs 300 and 356 together. In FIG. 3, similar reference labels are used for similar elements shown in FIGS. 1A and 2A. For example, substrate 300 in FIG. 3 corresponds to substrate 100 in FIG. 1A and to substrate 200 FIG. 2A.

SIWTs 301 and 305, in a first substrate 300, couple MMW signals from planar transmission lines on the first substrate 300 into external waveguides 332 and 352. First ends of waveguides 332 and 352 are mounted on SIWTs 301 and 305 on substrate 300. The orientation of the waveguides 332 and 352 is perpendicular to the plane of first substrate 300. The MMW signals with the same frequency or different frequencies can be generated by one or more MMW ICs mounted on the first substrate 300.

Second ends of waveguides 332 and 352 are mounted on SIWTs 354 and 358 on the second substrate 356. The second substrate 356 is arranged to be perpendicular to the waveguides 332 and 352 and is parallel to the first substrate 300. SIWTs 354 and 358 in the second substrate 356 couple MMW signals from external waveguides 332 and 352 onto planar transmission lines on the second substrate 356. The MMW signals may be routed to MMW ICs on the second substrate 356 for further processing. Alternatively, the second substrate can be a planar MMW antenna that broadcasts MMW signals. Each of the SIWTs is bidirectional and can either receive MMW signals from or transmit MMW signals into the waveguides 332 and 352.

Figure 4:
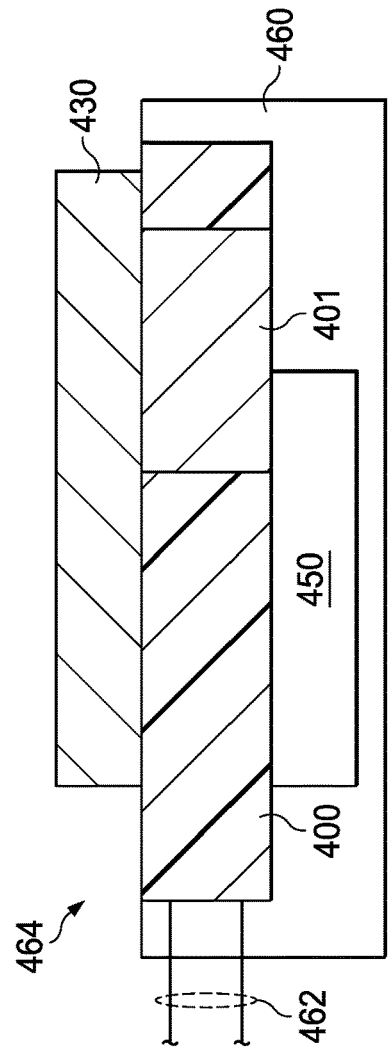
FIG. 4 is a packaged integrated circuit that contains a millimeter wave integrated circuit chip mounted on a substrate such as a printed circuit board with a substrate-integrated waveguide transition.
Figure 5:
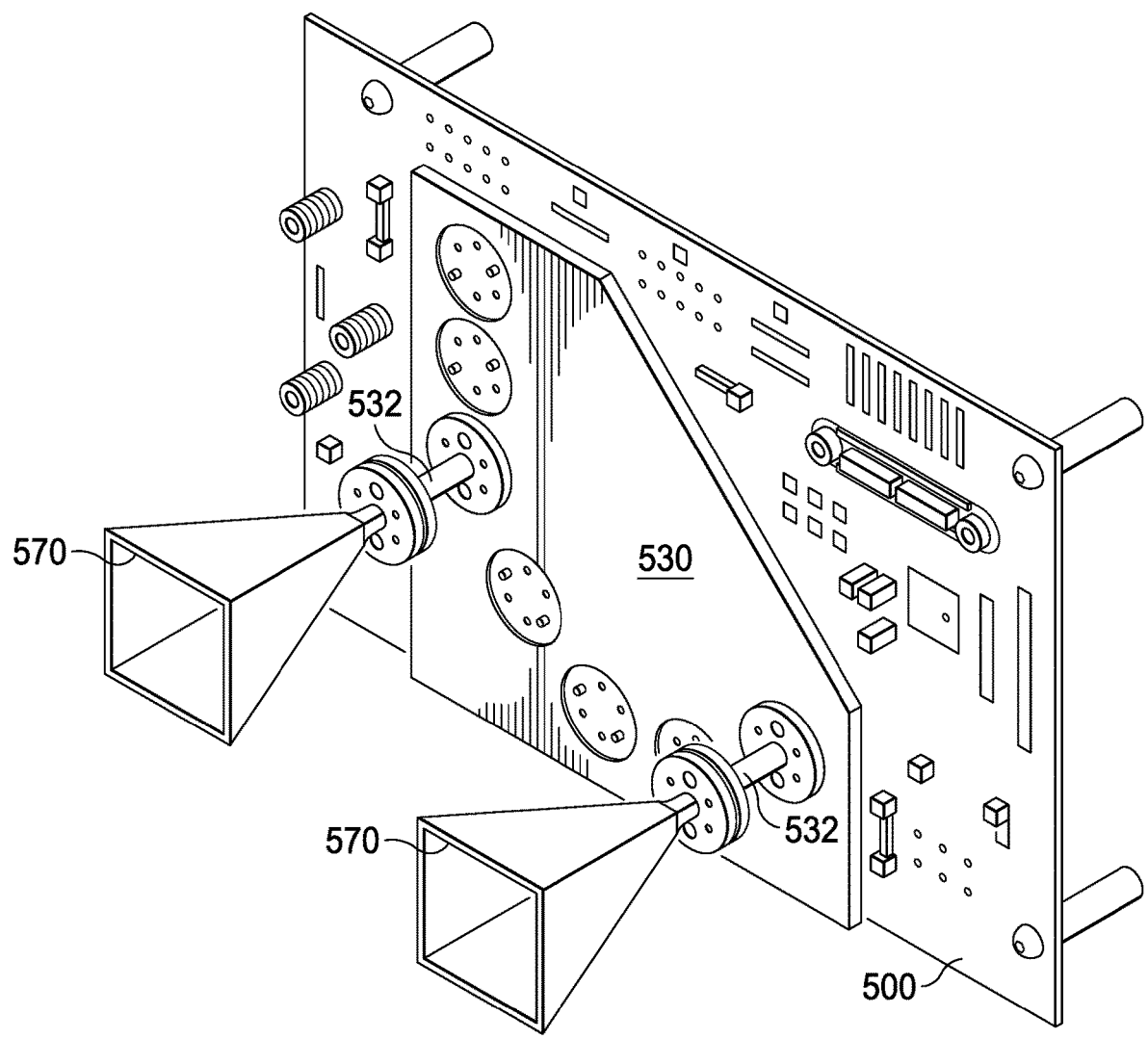
FIG. 5 is a prospective view of two microwave horn antennas mounted on waveguides attached to a substrate with substrate-integrated waveguide transitions.

FIG. 4 illustrates a packaged integrated circuit 464 using a substrate 400, a PCB in this example, with a SIWT 401. A MMW IC 450 is mounted on PCB 400 with the SIWT 401. An external waveguide mounting shim 430 is attached to the PCB 400 and the SIWT 401. The PCB 400 and MMW IC 450 are then housed in a protective package 460. The external waveguide mounting shim 430 is external to the package 460. Shim 430 provides a mounting surface for an external waveguide (not shown in FIG. 4) and a desired spacing from the PCB 400. The external waveguide mounted to the shim as is shown in FIG. 5 and is further described hereinbelow. Provision is made (signals 462) to provide power and signals to the MMW IC 450. This packaged integrated circuit 464 can be connected to the external waveguide to send and/or receive MMW signals.

FIG. 5 illustrates a projection of a substrate 500 with two SIWTs (not visible in FIG. 5). In this example 500, the substrate can be a PCB. An external waveguide mounting shim 530 is attached to and partially overlying the PCB 500 to enable external waveguides 532 to be mounted. Two external waveguides 532 are mounted on the waveguide mounting shim 530. A MMW horn antenna 570 is attached to each external waveguide 532. MMW signals can be transmitted or received through the MMW horn antennas 570. The SIWT couples (not visible in FIG. 5, see 101 in FIG. 1C for example) the received MMW signals to coplanar waveguides (not visible in FIG. 5) on the PCB 500 as described hereinabove.

Substrates (such as PCBs, for example) with one or more substrate integrated waveguide transitions (SIWTs) each with an integrated back short can be manufactured using standard substrate manufacturing processes. No additional post process steps are required. Use of the arrangements significantly reduces cost and significantly increases reliability of substrates with a built-in substrate waveguide transition.

Modifications are possible in the described examples, and other alternative arrangements are possible within the scope of the claims.

What is claimed is:

1. An integrated waveguide transition, comprising:
   a substrate with a waveguide side and an opposing waveguide termination side;
   a first layer of metal covering a portion of the waveguide side;
   a second layer of metal separated from the first layer of metal by a first layer of dielectric;
   a third layer of metal covering a portion of the waveguide termination side and separated from the second layer of metal by a second layer of dielectric;
   a substrate waveguide perpendicular to a plane of the substrate and extending from the waveguide side to the waveguide termination side of the substrate; and
   a length and a width of a cross section of the substrate waveguide defined by a fence of ground-stitching vias that short the first layer of metal and the second layer of metal to a plate of the third layer of metal that forms a back short of the substrate waveguide.

2. The integrated waveguide transition of claim 1, wherein a spacing between the ground-stitching vias is less than one-quarter of a center operating wavelength.

3. The integrated waveguide transition of claim 1, in which the substrate is a printed circuit board (PCB), and a thickness of the second dielectric is about one-quarter plus or minus five percent of a center operating wavelength.

4. The integrated waveguide transition of claim 1, in which the width and length of a cross section of the substrate waveguide are equal, and the substrate waveguide is circular.

5. The integrated waveguide transition of claim 1, in which the width and length of a cross section of the substrate waveguide are not equal, and the substrate waveguide is rectangular.

6. The integrated waveguide transition of claim 1, in which the width of a cross section of the substrate waveguide is about 2 millimeters and the length of the cross section of the substrate waveguide is about 2.45 millimeters.

7. The integrated waveguide transition of claim 1, further including:
   a first substrate waveguide opening with a first perimeter in the first layer of metal;
   a second substrate waveguide opening with a second perimeter in the second layer of metal; and
   the second perimeter is aligned with the first perimeter.

8. The integrated waveguide transition of claim 7, and further including:
   the fence of ground-stitching vias adjacent to and surrounding the first and second perimeters; and
   the ground-stitching vias short the first layer of metal and the second layer of metal to the plate.

9. The integrated waveguide transition of claim 7, in which a width of the first and second substrate waveguide openings are about 1.45 mm and a length of the first and second substrate waveguide openings are about 1.9 mm.

10. The integrated waveguide transition of claim 7, in which an operating bandwidth of the integrated substrate waveguide transition is 71 to 86 GHz.

11. An apparatus, comprising:
    a substrate with a waveguide side and an opposing waveguide termination side, and further including:
    a first layer of metal covering a portion of the waveguide side;
    a second layer of metal electrically isolated from the first layer of metal by a first dielectric layer;
    a third layer of metal electrically isolated from the second layer of metal by a second dielectric layer and covering a portion of the waveguide termination side; and
    the first, second, and third layers of metal lying in planes parallel with a plane of the substrate;
    a waveguide perpendicular to the plane of the substrate and extending from the waveguide side of the substrate to the waveguide termination side of the substrate, the waveguide having a first waveguide opening with a first perimeter in the first layer of metal, a second waveguide opening with a second perimeter in the second layer of metal, a length and width of a cross section of the waveguide defined by a length and width of a fence of ground-stitching vias adjacent to and surrounding the first and second perimeters, the ground-stitching vias shorting the first layer of metal and the second layer of metal to a plate of third layer metal; and
    the plate of third layer metal covering an end of the waveguide on the waveguide termination side of the substrate, and the plate forming a back short of the waveguide.

12. The apparatus of claim 11, in which a spacing between the ground-stitching vias is less than one-quarter of a center operating wavelength.

13. The apparatus of claim 11, in which a thickness of the second layer of dielectric is about one-quarter plus or minus five percent of a center of an operating wavelength.

14. The apparatus of claim 11, in which a reflection coefficient is less than minus ten dB and an insertion loss is less than one dB.

15. The apparatus of claim 11, in which the width and length of a cross section of the waveguide are not equal, and the waveguide is rectangular.

16. The apparatus of claim 11, in which the waveguide is rectangular, and the width of a cross section of the substrate waveguide is about 2 mm and the length of the cross section of the waveguide is about 2.45 mm.

17. The apparatus of claim 11, in which a cross section of the waveguide is rectangular and a width of the first and second waveguide openings is about 1.45 mm and a length of the first and second waveguide openings is about 1.9 mm.

* * * * *